(12) United States Patent
Nishihara et al.

(10) Patent No.: US 7,553,766 B2
(45) Date of Patent: Jun. 30, 2009

(54) METHOD OF FABRICATING SEMICONDUCTOR INTEGRATED CIRCUIT DEVICE

(75) Inventors: Shinji Nishihara, Kokubunji (JP); Shuji Ikeda, Koganei (JP); Naotaka Hashimoto, Koganei (JP); Hiroshi Momiji, London (GB); Hiromi Abe, Tokyo (JP); Shinichi Fukada, Hino (JP); Masayuki Suzuki, Kokubunji (JP)

(73) Assignee: Renesas Technology Corp., Tokyo (JP)

(*) Notice: Subject to any disclaimer, the term of this patent is extended or adjusted under 35 U.S.C. 154(b) by 22 days.

(21) Appl. No.: 11/950,152

(22) Filed: Dec. 4, 2007

(65) Prior Publication Data

US 2008/0090358 A1    Apr. 17, 2008

Related U.S. Application Data

(63) Continuation of application No. 11/783,187, filed on Apr. 6, 2007, now Pat. No. 7,314,830, which is a continuation of application No. 11/006,702, filed on Dec. 8, 2004, now Pat. No. 7,214,577, which is a continuation of application No. 10/721,902, filed on Nov. 26, 2003, now Pat. No. 6,858,484, which is a continuation of application No. 09/380,735, filed as application No. PCT/JP97/00810 on Mar. 14, 1997, now Pat. No. 6,693,001.

(51) Int. Cl.
    *H01L 21/44* (2006.01)
(52) U.S. Cl. ............... 438/682; 257/E21.199; 257/E21.2
(58) Field of Classification Search ............ 438/682; 257/E21.199, E21.2, E21.203, E21.438, E21.593, 257/E21.622
    See application file for complete search history.

(56) References Cited

U.S. PATENT DOCUMENTS

| 4,821,085 A | 4/1989 | Haken et al. |
| 5,047,367 A | 9/1991 | Wei et al. |
| 5,268,590 A | 12/1993 | Pfiester et al. |
| 5,316,977 A | 5/1994 | Kunishima et al. |
| 5,576,579 A | 11/1996 | Agnello et al. |
| 5,635,426 A | 6/1997 | Hayashi et al. |
| 5,652,176 A | 7/1997 | Maniar et al. |

(Continued)

FOREIGN PATENT DOCUMENTS

JP    5-90293    4/1993

(Continued)

OTHER PUBLICATIONS

Official Action, for Japanese 1998 Patent Application No. 540301, mailed Sep. 12, 2006.

(Continued)

*Primary Examiner*—Walter L Lindsay, Jr.
(74) *Attorney, Agent, or Firm*—Antonelli, Terry, Stout & Kraus, LLP.

(57) ABSTRACT

A Co silicide layer having a low resistance and a small junction leakage current is formed on the surface of the gate electrode, source and drain of MOSFETS by silicidizing a Co film deposited on a main plane of a wafer by sputtering using a high purity Co target having a Co purity of at least 99.99% and Fe and Ni contents of not greater than 10 ppm, preferably having a Co purity of 99.999%.

9 Claims, 20 Drawing Sheets

U.S. PATENT DOCUMENTS

| | | | |
|---|---|---|---|
| 5,691,225 A | 11/1997 | Abiko | |
| 5,721,175 A | 2/1998 | Kunishima et al. | |
| 5,736,461 A | 4/1998 | Berti et al. | |
| 5,742,090 A | 4/1998 | Stolmeijer et al. | |
| 5,780,361 A | 7/1998 | Inoue | |
| 5,780,362 A | 7/1998 | Wang et al. | |
| 5,843,841 A | 12/1998 | Izawa et al. | |
| 5,850,096 A | 12/1998 | Izawa et al. | |
| 5,998,284 A | 12/1999 | Azuma | |
| 6,018,185 A | 1/2000 | Mitani et al. | |
| 6,124,189 A | 9/2000 | Watanabe et al. | |
| 6,136,705 A | 10/2000 | Blair | |
| 6,747,316 B2 | 6/2004 | Matsuoka et al. | |
| 7,314,830 B2 * | 1/2008 | Nishihara et al. | 438/682 |
| 2003/0211673 A1 * | 11/2003 | Nakamura et al. | 438/197 |
| 2007/0184603 A1 * | 8/2007 | Nishihara et al. | 438/199 |
| 2008/0090358 A1 * | 4/2008 | Nishihara et al. | 438/278 |

FOREIGN PATENT DOCUMENTS

| | | |
|---|---|---|
| JP | 5-102078 | 4/1993 |
| JP | 05-182982 | 7/1993 |
| JP | 5-182985 | 7/1993 |
| JP | 5-343632 | 12/1993 |
| JP | 6-192874 | 7/1994 |
| JP | 6-192879 | 7/1994 |
| JP | 6-204420 | 7/1994 |
| JP | 7-3486 | 1/1995 |
| JP | 07-3486 | 1/1995 |
| JP | 7-78788 | 3/1995 |
| JP | 07-193237 | 7/1995 |
| JP | 8-167661 | 6/1996 |
| JP | 8-279509 | 10/1996 |
| JP | 09-17883 | 1/1997 |
| JP | 9-69497 | 3/1997 |
| JP | 9-82810 | 3/1997 |
| JP | 9-293790 | 11/1997 |
| JP | 9-312391 | 12/1997 |
| JP | 9-320990 | 12/1997 |
| JP | 10-74846 | 3/1998 |
| JP | 10-163485 | 6/1998 |
| JP | 10-294462 | 11/1998 |

OTHER PUBLICATIONS

D.L. Kwong, et al., silicided shallow junctio formation by ion implantation of impurity ions into silicide layers and subsequent drive.

R. Liu, et al., Formation of Shallow $p^+/n$ and $n^+/p$ Junctions with $CoSi_2$, pp. 446-462.

Chih-Yuan Lu, et al., A Folded Extended Window MOSFET for ULSI Applications, Aug. 1988, pp. 388-390, IEEE Electron Device Letters, vol. 9, No. 8.

Chinese Office Action dated Dec. 27, 2002, for corresponding Application No. 97182025.2 with English Translation.

Patent Abstracts of Japan, for Publication No. 07003486A, published Jan. 6, 1995.

Shyam P. Muraka, Self-aligned silicides or metals for very large scale integrated circuit applications, Nov./Dec. 1986, pp. 1325-1331, J. Vac. Sci. Technol. B 4 (6).

Eiji Nagasawa, et al., Mo- and Ti-Silicided Low-Resistance Shallow Junctions Formed Using the Ion Implantation Through Metal Technique, Mar. 1987, IEEE Transactions On Electron Devices, vol. Ed-34, No. 3.

W.T. Lynch, et al., Self-Aligned Contact Schemes For Source-Drains In Submicron Devices, 1987, pp. 354-357, IEEE.

J.M. Poate, Silicide Formation, Thin Films—Interdiffusion and Reactions, pp. 359-405.

Thomas E. Tang, et al., Titanium Nitride Local Interconnect Technology for VLSI, Mar. 1987, pp. 682-688, Electron Devices, vol. Ed-34, No. 3.

R.D.J. Verhaar, et al., Self-aligned $CoSi_2$ in a Submicron CMOS Process, pp. 229-232.

Takao, et al., "A 4-um$^2$ Full-CMOS SRAM Cell Technology for 0.2-um High-Performance Logic LSIs", 1997 Symposium on VLSI Technology Digest of Technical Papers, pp. 11 and 12.

* cited by examiner (a) WITHOUT HEAT-TREATMENT (b) WITH HEAT-TREATMENT (700 °C, 30 MINUTES)

n CHANNEL MOSFET     p CHANNEL MOSFET

METHOD OF FABRICATING SEMICONDUCTOR INTEGRATED CIRCUIT DEVICE

This application is a Continuation application of application Ser. No. 11/783,187, filed Apr. 6, 2007 now U.S. Pat. No. 7,314,830, which is a Continuation application of application Ser. No. 11/006,702, filed Dec. 8, 2004 now U.S. Pat. No. 7,214,577, which is a Continuation application of application Ser. No. 10/721,902, filed Nov. 26, 2003 now U.S. Pat. No. 6,858,484, which is a Continuation application of application Ser. No. 09/380,735, originally submitted Sep. 13, 1999, and wherein the last of the 35 USC §371(c) requirements has been filed on Feb. 4, 2000 now U.S. Pat. No. 6,693,001, application Ser. No. 09/380,735 including a Continued Prosecution Application filed Apr. 3, 2002, and wherein Application Ser. No. 09/380,735 is a national stage application filed under 35 USC §371 of International Application No. PCT/JP97/00810, filed Mar. 14, 1997. The contents of Application Ser. No. 09/380,735 are incorporated herein by reference in their entirety.

TECHNICAL FIELD

This invention relates to a fabrication technology of a semiconductor integrated circuit device. More particularly, this invention relates to a technology which will be effective when applied to a "Salicide" (self-aligned silicide) process using a Co (cobalt) film formed by sputtering.

BACKGROUND OF THE INVENTION

Polycrystalline silicon and Al (aluminum) have been used mainly in the past as electrode and wiring materials of semiconductor integrated circuits formed on a Si (silicon) substrate. As semiconductor devices have been scaled down in recent years, however, attempts have been made to introduce refractory metals such as W (tungsten), Ti (titanium), cobalt, etc, and their silicide compounds, as new electrode and wiring materials because these metals and metal compounds have lower resistance than Si and higher electromigration resistance than Al.

The refractory metal (silicide) film for these electrode and wiring materials is formed on a semiconductor wafer by sputtering in argon a target that is prepared by sintering powder of the refractory metal (silicide).

Japanese Patent Laid-Open Nos. 192974/1994, 192979/1994 and 3486/1995 disclose a technology for producing high purity Co which reduces its impurity contents, particularly the Ni (nickel) and Fe (iron) contents, and has a purity of over 99.999% (5N), by an electrolytic refining process. This high purity Co is applied to the production of a Co target for forming a Co film used for the electrodes and wiring lines (electrodes, gates, wiring lines, devices, protective films, etc.) of semiconductor devices.

Japanese Patent Laid-Open No. 1370/1993 describes a method of producing a refractory metal silicide target for sputtering, capable of restricting the formation of particles that would otherwise result in breakage and short-circuit of the electrodes and wiring lines. This reference illustrates W, Mo (molybdenum), Ta (tantalum), Ti, Co and Cr (chromium) as the refractory metals.

The refractory metal silicide film can be formed by a refractory metal film to react with silicon, besides the method described above that uses the target of the refractory metal silicide.

Japanese Patent Laid-Open No. 321069/1995 describes a so-called "Salicide process" which comprises the steps of forming a Co—Ti film on the entire surface of a semiconductor substrate, on which MOSFETs (Metal Oxide Semiconductor Field Effect transistors) are formed, by a magnetron sputtering process using a composite metal target constituted by 20 atom % of a ferromagnetic material such as Co and 80 atom % of a paramagnetic material such as Ti, then conducting heat-treatment so as to form a Co silicide-Ti silicide mixture layer on the polycrystalline silicon gates as well as on the sources and drains, removing unreacted potions of the mixture layer by etching, and conducting again the heat-treatment to thereby reduce the resistance of the mixture layer.

DISCLOSURE OF THE INVENTION

In order to achieve high operation speed, high performance and low power consumption of large-scale semiconductor devices using very small MOSFETs fabricated by a deep sub-micron design rule of not greater than 0.25 μm, for example, it is essentially necessary to materialize the high-speed operation of discrete MOSFETs in addition to the reduction of the delay in wiring lines. For, the source/drain resistance of the MOSFET increases when the MOSFET is scaled down, and this increase in the resistance is a critical factor that impedes the high-speed operation of the transistors. In the case of low power consumption devices for driving the transistors at a low voltage of 2 V or below, in particular, the improvement of the operation speed of the discrete MOSFET is the critical problem.

When the MOSFET is driven at a low voltage of 2 V or below, it becomes difficult to control a threshold voltage (Vth) in a buried channel type structure, in which the gate electrode is constituted by n type polycrystalline silicon, as is the case with p channel MOSFETs of the prior art. Therefore, how to control the threshold voltage is another problem.

The inventors of the present invention have examined the introduction of the Salicide process for forming a low-resistance high melting silicide layer on the polycrystalline silicon gates and on both source and drain so as to solve the problem of the high-speed operation of the MOSFET. The inventors have selected Co (cobalt) that provides a low resistance silicide of about 15 μΩcm as a refractory metal material. To control the threshold voltage of the MOSFET, on the other hand, the inventors have attempted to introduce a dual-gate CMOS structure in which the gate electrode of p channel MOSFETs is constituted into a surface channel type by p type polycrystalline silicon while the gate electrode of n channel MOSFETs is constituted into the surface channel type by n type polycrystalline silicon. To introduce this dual-gate CMOS structure, the connection method of the p type polycrystalline silicon gate and the n type polycrystalline silicon gate becomes the problem, but this problem can be solved by combining this structure with the Salicide process for forming the silicide layer on the polycrystalline silicon gates.

The process for forming the Co silicide layer on the polycrystalline silicon gates and on the source and drain of the MOSFET is as follows.

First, a Co film is deposited on a semiconductor substrate having MOSFETs formed thereon, by a sputtering process using a Co target, and heat-treatment is then effected so as to permit Co and Si to react with each other and to thereby form a Co silicide layer on the surface of each of the gate, source and drain (first heat-treatment). The Co silicide obtained at this time is a mono-silicide (CoSi) having a relatively high resistance of 50 to 60 μΩcm. After the unreacted Co film is removed by wet etching, heat-treatment is carried out once again to cause the phase transition of the mono-silicide to a di-silicide ($CoSi_2$) having a low resistance (second heat-treatment).

When the present inventors have carried out the first heat-treatment for the Co film formed by using Co target having a purity of 99.9%, however, the film thickness of the resulting Co mono-silicide (CoSi) exhibits high dependence on the temperature change of the heat-treatment. More concretely, the phenomenon is observed in which the film thickness becomes greater with a higher heat-treatment temperature and smaller with a lower heat-treatment temperature. Consequently, the film thickness cannot be controlled stably. Presumably, such a variation of the film thickness results mainly from silicidization of a part of impurity transition metals such as Fe and Ni contained in the Co target.

The result of the studies described above suggests that in order to obtain a Co silicide layer having a low resistance, the film thickness of the mono-silicide layer must be made sufficiently large by setting the temperature of the first heat-treatment to a high level. When the film thickness of the mono-silicide layer becomes large, however, a junction leakage current increases in 0.25 μm MOS devices in which the source-drain p-n junction is shallower than 0.3 μm. It is assumed that excessive inter-lattice Si formed by the reaction between Co, which enters the substrate, and Si, gathers and grows to thereby invite this increase in the junction leakage current.

If the first heat-treatment temperature is raised, an undesirable silicidization reaction is likely to occur at the source-drain end portion and to result in so-called "creep-up", or the phenomenon in which the silicide layer extends up to the field insulating film and the gate side wall insulating film. As a result, short-circuit develops in MOSFETs of a very small size between the gate and the source, between the gate and the drain and between the sources and the drains of adjacent MOSFETS. When the first heat-treatment is applied to the dual gate CMOSs, in particular, B (boron) as the impurity in p type polycrystalline silicon, that constitutes the gate electrode of the p channel MOSFET, is likely to diffuse into the gate oxide film with the result that electric characteristics of the transistors are likely to fluctuate.

On the other hand, when the film thickness of the mono-silicide layer is reduced by setting the first heat-treatment temperature to a low level so as to avoid the increase in the junction leakage current, the resistance of the silicide layer increases. When the heat-treatment temperature is low, the progress of the silicidization reaction becomes slow, too, so that the resistance of the silicide layer further increases. Furthermore, the heat resistance of the Co silicide layer drops when its film thickness becomes small. In consequence, agglomeration of the crystal grains of the Co silicide occurs during the heat-treatment process after the formation of the MOSFET (e.g. the process in which a silicon oxide film containing P (phosphorus) doped thereto is deposited on the MOSFET and is then sintered at a high temperature in order to getter a metal such as Na (sodium)). Consequently, the abnormal increase in the resistance occurs.

Therefore, a method of fabricating a semiconductor integrated circuit device according to the present invention comprises the following steps (a) to (d):

(a) a step of forming MOSFETs on a main plane of a wafer;

(b) a step of depositing a Co film to regions of the main plane of the wafer including at least the upper portions of the gate electrode and the source and drain of the MOSFET by sputtering using a high purity Co target;

(c) a step of forming a Co silicide layer on the surface of the gate electrode and the source and drain of each MOSFET by applying a first heat-treatment to the wafer so as to allow Co and Si to react with each other; and (d) a step of removing the unreacted portions of the Co film and then applying a second heat-treatment to the wafer so as to reduce the resistance of the Co silicide layer.

When the $CoSi_2$ layer is formed on the silicon surface by the reaction of Co with Si, the fabrication method of the semiconductor integrated circuit device according to the present invention reduces the sheet resistance of the $CoSi_2$ layer to 10 Ω/square or below by using the high impurity Co target capable of providing the CoSi layer that has low temperature dependence on at least the first heat-treatment temperature and has improved film thickness controllability.

The high purity Co target used in the present invention has a Co purity of at least 99.99% and a Fe or Ni content of not greater than 10 ppm, or the sum of the Fe and Ni contents of not greater than 50 ppm. Preferably, the Co purity is at least 99.99% and the Fe and Ni contents are not greater than 10 ppm and more preferably, the Co. purity is 99.999%.

The term "wafer" used in this specification means a sheet-like article at least a part of which comprises a single, or a plurality of, single crystal regions (mainly silicon in the invention) after at least prescribed process steps that form the semiconductor integrated circuit device mainly on the main surface region thereof. The term "semiconductor integrated circuit device" used herein means not only those which are formed on ordinary single crystal wafers but on other substrates, such as TFT liquid crystals.

The summary of the inventions disclosed herein can be itemized as follows.

(1) A method of fabricating a semiconductor integrated circuit device comprising the steps of:

(a) forming MOSFETs on a main plane of a wafer;

(b) depositing a Co film in regions of the main plane of the wafer including at least the gate electrode and the source and drain of each MOSFET by sputtering using a high purity Co target;

a step of applying a first heat-treatment to the wafer so as to allow Co and Si to react with each other and to form a Co silicide layer on the surfaces of the gate electrode and the source and drain of each MOSFET; and (d) removing the unreacted portions of the Co film and applying a second heat-treatment to the wafer so as to reduce the resistance of the Co silicide layer.

(2) According to the method of fabricating a semiconductor integrated circuit device of the invention described above, the Co purity of the Co target is at least 99.99% and the Fe or Ni content is not greater than 10 ppm.

(3) According to the method of fabricating a semiconductor integrated circuit device described above, the Co purity of the Co target is at least 99.99% and the Fe and Ni contents are not greater than 50 ppm.

(4) According to the method of fabricating a semiconductor integrated circuit device described above, the Co purity of the Co target is at least 99.99% and the Fe and Ni contents are not greater than 10 ppm.

(5) According to the method of fabricating a semiconductor integrated circuit device described above, the Co purity of the Co target is 99.999%.

(6) According to the method of fabricating a semiconductor integrated circuit device described above, the temperature of the first heat-treatment is from 475 to 525° C.

(7) According to the method of fabricating a semiconductor integrated circuit device described above, the temperature of the second heat-treatment is from 650 to 800° C.

(8) According to the method of fabricating a semiconductor integrated circuit device described above, the film thickness of the Co film is from 18 to 60 nm.

(9) According to the method of fabricating a semiconductor integrated circuit device described above, the sheet resistance of the Co silicide layer after the application of the second heat-treatment is not greater than 10 Ω/square.

(10) According to the method of fabricating a semiconductor integrated circuit device described above, the junction depth of the source and the drain is not greater than 0.3 μm.

(11) A method of fabricating a semiconductor integrated circuit device according to the present invention comprises the steps of:

(a) depositing a polycrystalline silicon film and a first insulating film on a main plane of a wafer having a gate insulating film formed thereon, and patterning the first insulating film and the polycrystalline silicon film to thereby form a first gate electrode pattern in a first region of the wafer and a second gate electrode pattern in a second region;

(b) implanting an impurity ion of a first conductivity type into the first region of the wafer to form first conductivity type semiconductor regions having a low impurity concentration in the wafer on both sides of the first gate electrode pattern, and implanting an impurity ion of a second conductivity type into the second region of the wafer to form second conductivity type semiconductor regions in the wafer on both sides of the second gate electrode pattern;

(c) patterning the second insulating film deposited on the main plane of the wafer to form side wall spacers on side walls of the first and second gate electrodes, and removing the first insulating films of the first and second gate electrode patterns to expose the surface of the polycrystalline silicon film;

(d) implanting an impurity ion of the first conductivity type into the first region of the wafer to form a first gate electrode of the first conductivity type by the polycrystalline silicon film of the first gate electrode pattern and to form first conductivity type semiconductor regions having a high impurity concentration in the wafer on both sides of the first gate electrode, and implanting an impurity ion of the second conductivity type into the second region of the wafer to form a second gate electrode of the second conductivity type by the polycrystalline silicon film of the second gate electrode pattern, and to form second conductivity type semiconductor regions having a high impurity concentration in the wafer on both sides of the second gate electrode;

(e) depositing a Co film on the main plane of the wafer by sputtering using a high purity Co target;

(f) applying a first heat-treatment to the wafer to allow Co and Si to react with each other to thereby form a Co silicide layer on the surface of the first and second gate electrodes and the surface of the first and second conductivity type semiconductor regions having a high impurity concentration; and (g) removing the unreacted portion of the Co film and then applying a second heat-treatment to the wafer to lower the resistance of the Co silicide layer.

(12) According to the method of fabricating a semiconductor integrated circuit device of the present invention described above, an operating power source voltage of the MOSFET is not higher than 2 V.

(13) According to the method of fabricating a semiconductor integrated circuit device described above, the Co purity of the Co target is at least 99.99% and the Fe or Ni content is not greater than 10 ppm.

(14) According to the method of fabricating a semiconductor integrated circuit device described above, the Co purity of the Co target is at least 99.99% and the Fe and Ni contents are not greater than 50 ppm.

(15) According to the method of fabricating a semiconductor integrated circuit device described above, the Co purity of the Co target is at least 99.99% and the Fe and Ni contents are not greater than 10 ppm.

(16) According to the method of fabricating a semiconductor integrated circuit device described above, the Co purity of the Co target is 99.999%.

(17) A method of fabricating a semiconductor integrated circuit device according to the present invention comprising the steps of:

(a) forming MOSFETs on a main plane of a wafer and then exposing the surface of the gate electrode and the source and drain of each MOSFET;

(b) depositing a Co film on the main plane of the wafer including the surface of the gate electrode and the source and drain of the MOSFET by sputtering using a high purity Co target;

(c) applying a first heat-treatment to the wafer to allow Co and Si to react with each other to thereby form a Co silicide layer made mainly of Co mono-silicide on the surface of the gate electrode, the source and drain of the MOSFET;

(d) removing the unreacted portions of the Co film and then applying a second heat-treatment to cause phase transition of the Co silicide layer to a Co di-silicide layer made mainly of a Co di-silicide; and (e) depositing a silicon oxide film containing an impurity doped thereto to the upper part of the MOSFET so as to getter a metal impurity, and then applying a third heat-treatment to the silicon oxide film.

(18) According to the method of fabricating a semiconductor integrated circuit device of the invention described above, the silicon oxide film containing the impurity doped thereto is a PSG film.

(19) According to the method of fabricating a semiconductor integrated circuit device described above, the temperature of the third heat-treatment is from 700 to 800° C.

It is an object of the present invention to provide a Salicide process capable of forming a Co silicide layer having a low resistance and a small junction leakage current.

These and other objects and novel features of the present invention will become more apparent from the following description of the specification together with the accompanying drawings.

BEST MODE FOR CARRYING OUT THE INVENTION

Figure 1:
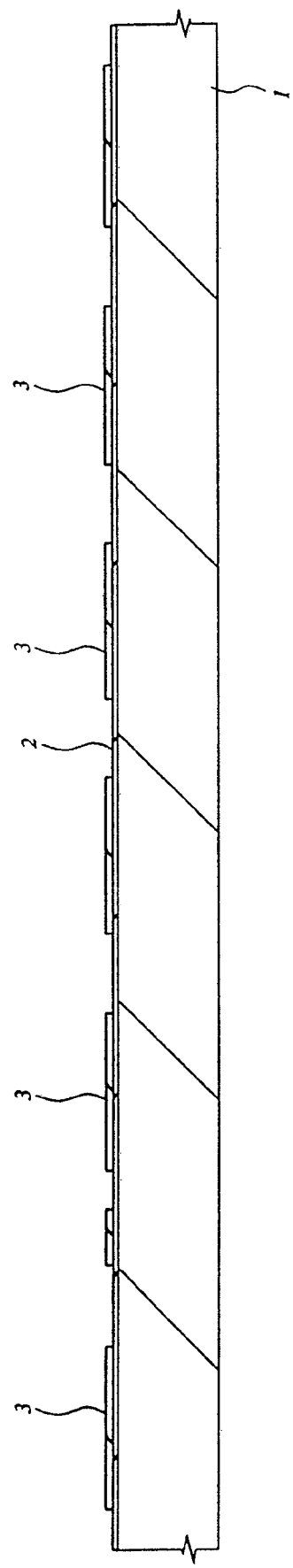
FIGS. 1 to 7, 9, 12, 13 and 16 to 20 are sectional views of principal portions of a semiconductor substrate, and show methods of fabricating a semiconductor integrated circuit device according to embodiments of the present invention.

The present invention will be described in further detail with reference to the accompanying drawings. In the explanation that follows, the same reference numeral will be used to identify a constituent element having the same function, and repetition of the explanation of such an element will be omitted.

The embodiment represents the example of the application of the present invention to a dual gate CMOS process in accordance with a 0.25 μm design rule, wherein an operating power source voltage is 2 V. Needless to say, however, the present invention is not limited to this embodiment.

A CMOSFET having a dual gate structure is fabricated in the following way. First, the surface of a semiconductor substrate 1 made of a p⁻ type single crystal silicon and having a resistivity of about 10 Ωcm is thermally oxidized so as to form a 10 nm-thick silicon oxide film 2. A 100 nm-thick silicon nitride film 3 is then deposited on this silicon oxide film 2 by a CVD process, as shown in FIG. 1. Next, this silicon nitride film 3 is patterned by dry etching using a photoresist as a mask so as to remove the silicon nitride film 3 of a device isolation region.

Figure 2:
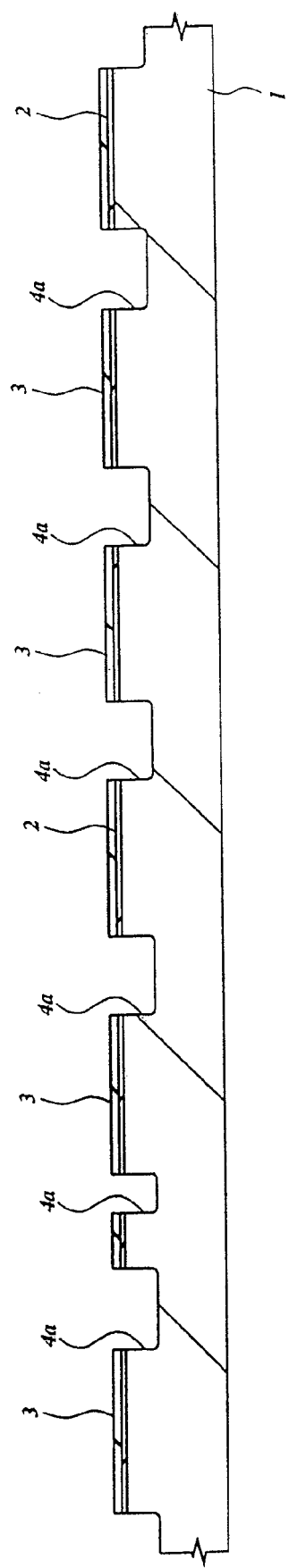

Next, as shown in FIG. 2, the silicon oxide film 2 and the semiconductor substrate 1 are etched by using the silicon nitride film 3 as the mask in such a manner as to form a 350 nm-deep trench 4a in the semiconductor substrate 1 of the device isolation region.

Figure 3:
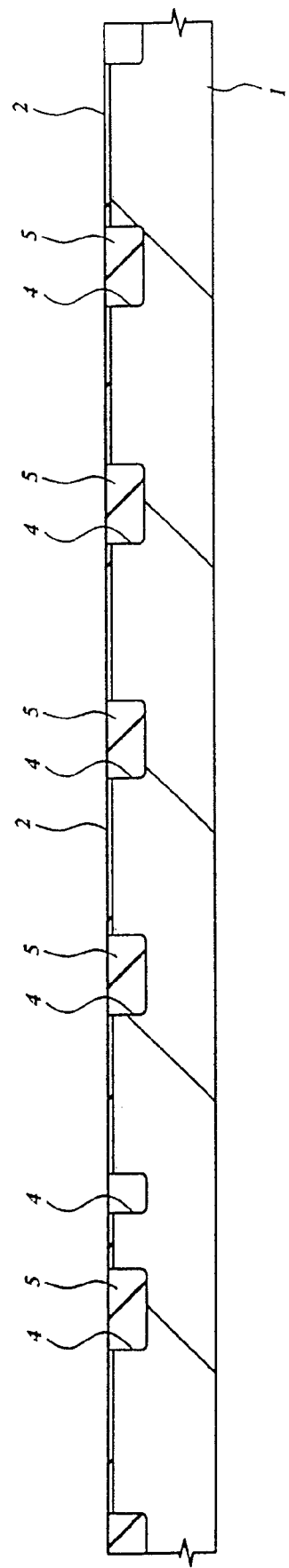

After a silicon dioxide film 5 is deposited on the semiconductor substrate 1 by the CVD process as shown in FIG. 3, the surface of this silicon oxide film 5 is polished flat and smooth by a CMP process in such a manner as to leave the silicon oxide film 5 inside the trench 4a and thus to form a device isolation trench 4. Subsequently, heat-treatment is carried out at 1,000° C. to densify the silicon oxide film 5 inside the device isolation trench 4 and then the silicon nitride film 3 is removed by wet etching using hot phosphoric acid.

Figure 4:
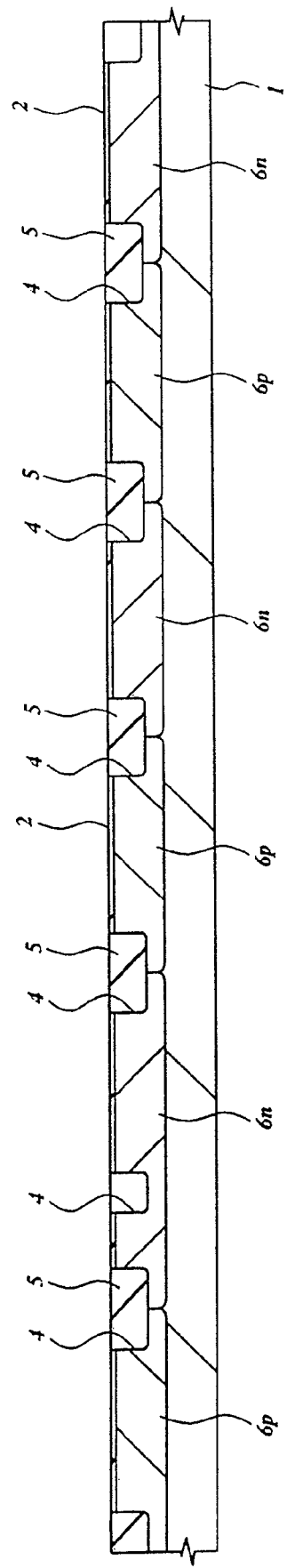

An n type well 6n and a p type well 6p are then formed in the semiconductor substrate 1 as shown in FIG. 4. First, an impurity for forming the n type well in the semiconductor substrate 1 is ion-implanted using a photoresist having an opening corresponding to a p channel MOSFET forming region as a mask, and then an impurity for adjusting the threshold voltage of the p channel MOSFET is ion-implanted. The impurity for forming the n type well is P (phosphorus), for example, and ion implantation is executed at energy of 360 keV and a dose of $1.5 \times 10^{13}/cm^2$. The impurity for adjusting the threshold voltage is P, for example, and ion implantation is executed at energy of 40 keV and a dose of $2 \times 10^{12}/cm^2$. After the photoresist is removed, an impurity for forming the p type well in the semiconductor substrate 1 is ion-implanted using a photoresist, that has an opening corresponding to an n channel MOSFET, as a mask, and an impurity ion for adjusting the threshold voltage of the n channel MOSFET is further ion-implanted. The impurity for forming the p type well is B (boron), for example, and ion implantation is executed at energy of 200 keV and a dose of $1.0 \times 10^{13}/cm^2$. The impurity for adjusting the threshold voltage is boron fluoride ($BF_2$) and ion implantation is executed at energy of 40 keV and a dose of $2 \times 10^{12}/cm^2$. Thereafter, the semiconductor substrate 1 is heat-treated at 950° C. for one minute to activate the impurities, thereby forming the n type well 6n and the p type well 6p.

Figure 5:
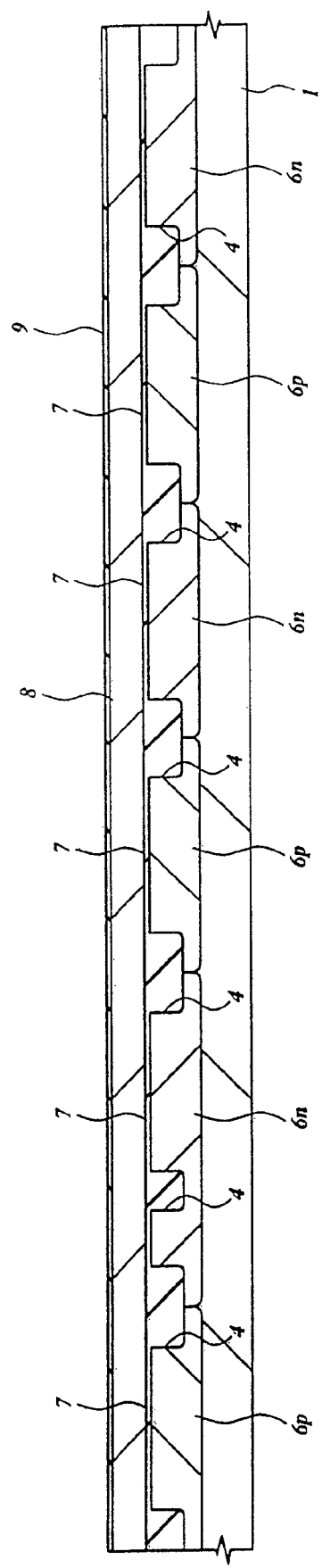

Next, a 4 nm-thick gate oxide film 7 is formed by thermally oxidizing the semiconductor substrate 1 on the surface of the active region of each of the n and p type wells 6n and 6p as shown in FIG. 5, and a 250 nm-thick polycrystalline silicon film 8 is deposited by the CVD process on the semiconductor substrate 1. Furthermore, a silicon oxide film 9 is deposited on the polycrystalline silicon film 8 by CVD. None of the n type impurity and the p type impurity are doped into the polycrystalline silicon film 8.

Figure 6:
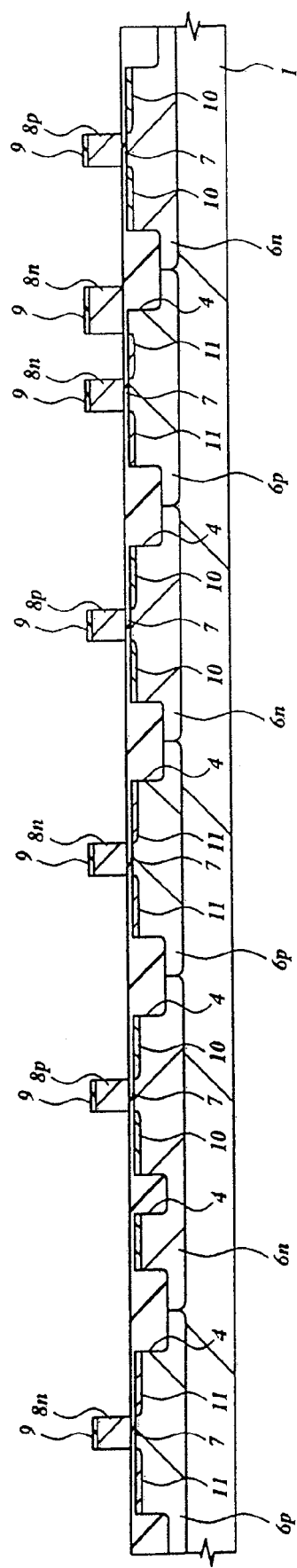

As shown in FIG. 6, the silicon oxide film 9 and the polycrystalline silicon film 8 are then etched by using the photoresist as the mask in such a manner as to form the gate electrode 8n of the n channel MOSFET on the p type well 6p and the gate electrode 8p of the p channel MOSFET on the n type well. These gate electrodes 8n and 8p are shaped to a gate length of 0.25 μm.

Next, a p type impurity ($BF_2$) is ion-implanted to the n type well 6n by using the photoresist and the gate electrode 8p as the mask at energy of 20 keV and a dose of $7.0 \times 10^{13}/cm^2$, and an n type impurity (arsenic (As)) is ion-implanted to the p type well 6p at energy of 20 keV and a dose of $3.0 \times 10^{14}/cm^2$ by using the photoresist and the gate electrode 8n as the mask. Subsequently, the semiconductor substrate 1 is heat-treated at 1,000° C. for 10 seconds so as to activate the impurities and to form a p⁻ semiconductor regions 10 in the n type wells 6n on both sides of the gate electrode 8p and n⁻ semiconductor regions 11 in the p type wells 6p on both sides of the gate electrode 8n.

Figure 7:
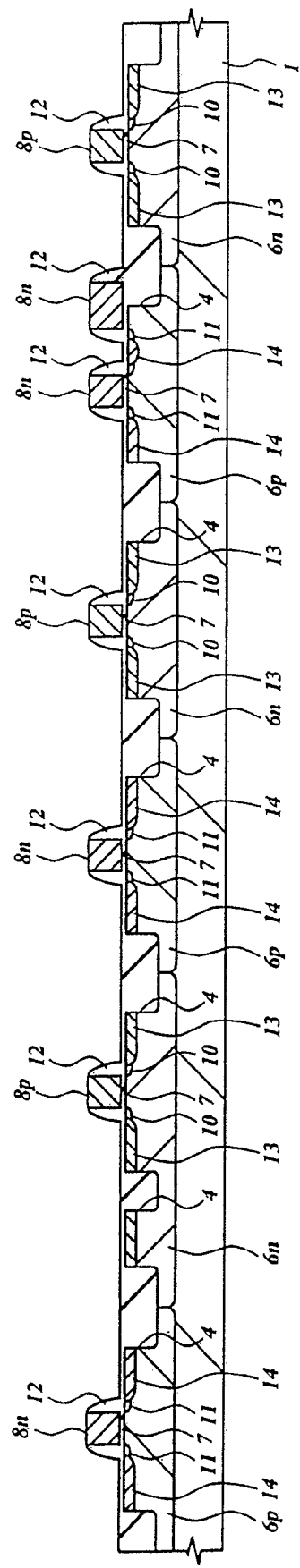

Side wall spacers 12 having a film thickness of 0.1 μm in the gate length-wise direction are formed on the side walls of the gate electrodes 8n and 8p as shown in FIG. 7. The side wall spacer 12 is formed by anisotropically etching the silicon oxide film deposited by CVD to the semiconductor substrate 1 by reactive etching. When this etching is carried out, the silicon oxide film 9 on the gate electrodes 8n and 8p, too, is etched simultaneously, and the surface of the gate electrodes 8n and 8p is exposed.

A p type impurity (B) is then ion-implanted to the n type well 6n and the gate electrode 7p by using the photoresist as the mask at energy of 20 keV and a dose of $1.0 \times 10^{14}/cm^2$, and the p type impurity (B) is again ion-implanted at energy of 5 keV and a dose of $2.0 \times 10^{15}/cm^2$. Next, after an n type impurity (P) is ion-implanted by using the photoresist as the mask to the p type well 6p and the gate electrode 8n at energy of 40 keV and a dose of $2.0 \times 10^{14}/cm^2$, an n type impurity (As) is ion-implanted at energy of 60 keV and a dose of $3.0 \times 10^{15}/cm^2$. Subsequently, the semiconductor substrate 1 is heat-treated at 1,000° C. for 10 seconds so as to activate the impurities, to thereby form a p⁺ semiconductor region 13 in the n type well 6n and to convert the conductivity type of the gate electrode 8p to the p type. Also, an n⁺ semiconductor region 14 is formed in the p type well 6p, and the conductivity type of the gate electrode 8n is converted to the n type. The p⁺ semiconductor region 13 and the n⁺ semiconductor region 14 are formed into the junction depth of 0.2 to 0.1 μm.

Figure 8:
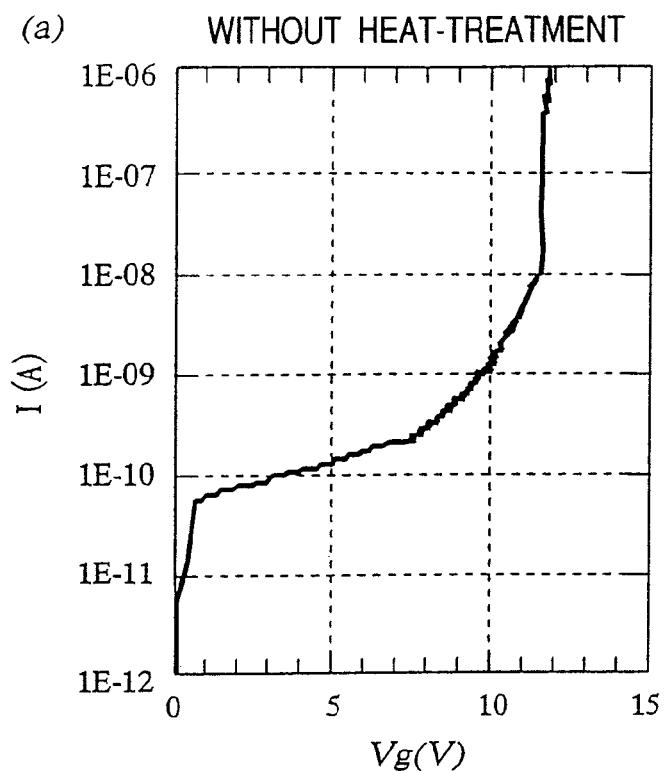
FIG. 8 is a graph showing the relationship between heat-treatment at 750° C. for 30 minutes for activating an impurity and a leakage current of the source and drain formed of this impurity.
Figure 8:
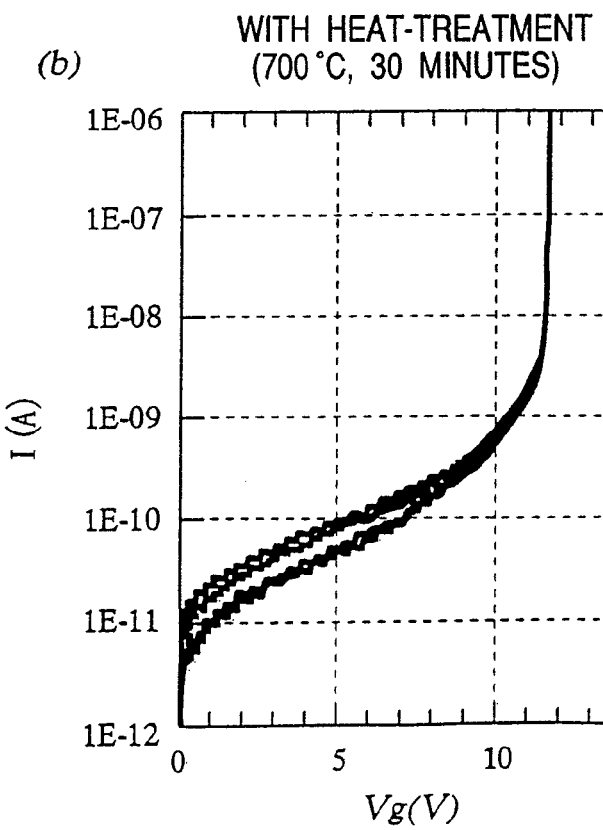

Incidentally, the (n⁺/p) junction leak of the n⁺ semiconductor region 14 can be reduced by heat-treating the semiconductor substrate 1 at 750° C. for 30 minutes prior to the heat treatment (at 1,000° C. for 10 seconds) for activating the n type impurity and the p type impurity described above, as shown in FIG. 8. This is because the spot defect introduced into the semiconductor substrate 1 at the time of ion implantation is recovered by this heat-treatment. Though the p⁺ semiconductor region 13, too, is expected to provide a similar effect in this case, the impurity (B) of the p⁺ semiconductor region 13 has a high diffusion rate and diffuses to a certain extent even by the heat-treatment at such a temperature. To prevent this diffusion, it is possible to first conduct heat-treatment at 750° C. for 30 minutes immediately after the ion-implantation for forming the n+ semiconductor region 14 and then to conduct heat-treatment at 1,000° C. for 10 seconds after the ion-implantation for forming the p+ semiconductor region 13.

Figure 9:
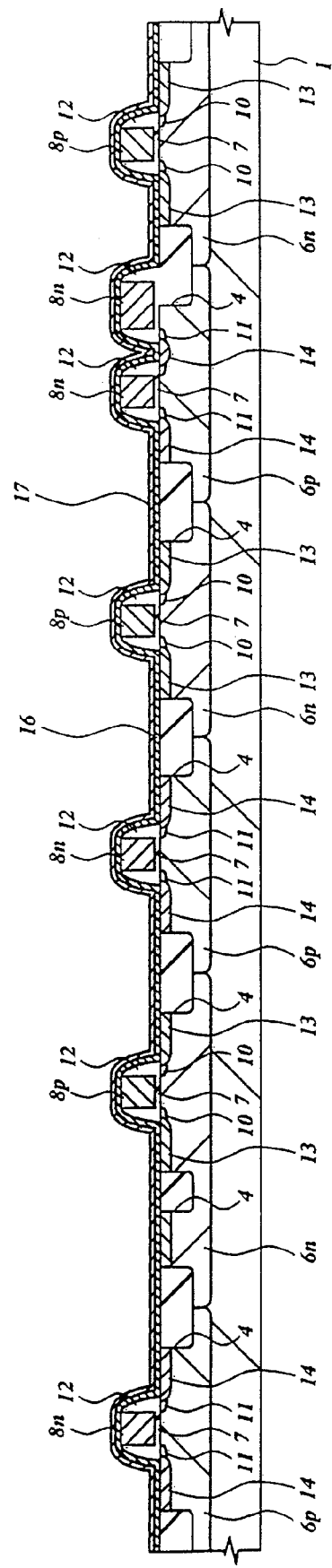

After the gate oxide film 7 on the surface of the p+ semiconductor region 13 and the n+ semiconductor region 14 is removed by wet etching using hydrofluoric acid (HF), a 15 nm-thick Co film 16 is deposited on the semiconductor substrate 1 by sputtering using a Co target and furthermore, a 10 to 15 nm-thick oxidation preventing film 17 is deposited on this Co film 16, as shown in FIG. 9. A TiN film deposited by sputtering, for example, is used for the oxidation preventing film 17. The film thickness of the Co film 16 is preferably within the range of 18 to 60 nm. If the film thickness is not greater than 18 nm, it becomes difficult to lower the sheet resistance of the Co silicide layer to 10 Ω/square or below and if it exceeds 60 nm, the source-drain junction leakage current increases.

Figure 10:
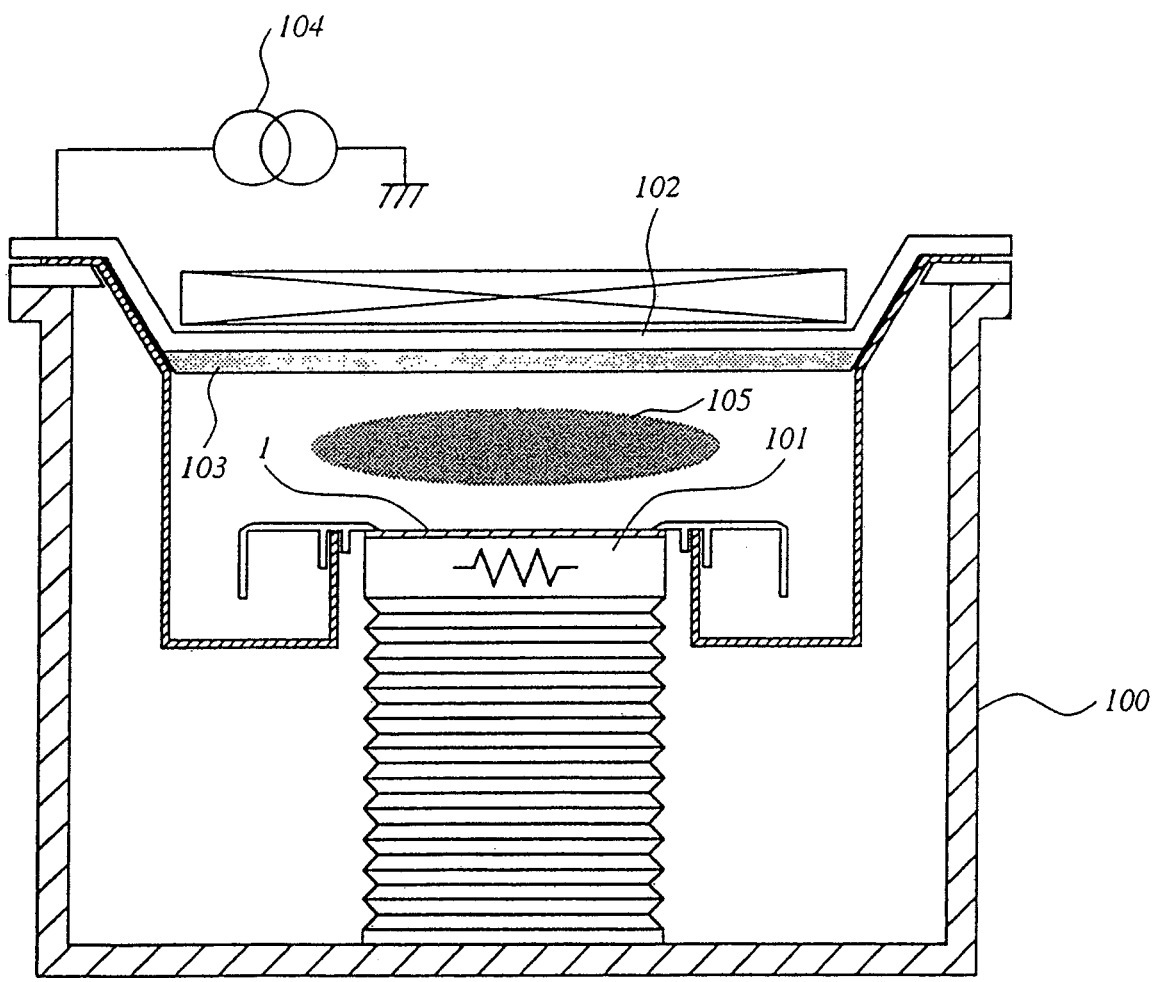
FIG. 10 is a schematic view of a chamber of a sputtering apparatus used for depositing a Co film.

FIG. 10 is a schematic view of a chamber of a sputtering apparatus used for the deposition of the Co film 16 described above. This chamber 100 can be evacuated, and an Ar gas is introduced into this chamber, which is kept at several mTorr at the time of the film formation. A Co target 103 held by a sputter electrode 102 is so disposed above a holder 101 for holding the semiconductor substrate 1 (wafer) as to oppose the semiconductor substrate 1. When a power source 104 connected to the Co target 103 is operated and constant discharge is started, a plasma 105 is generated by a high negative voltage applied to the Co target in a gap between the Co target 103 and the semiconductor substrate 1. When the Ar ions accelerated from this plasma 105 towards Co target 103 impinge against the surface of the Co target 103, the constituent material (Co) of the target scatters in the molecular (atomic) level and a Co film 16 is deposited on the surface of the semiconductor substrate 1.

Figure 11:
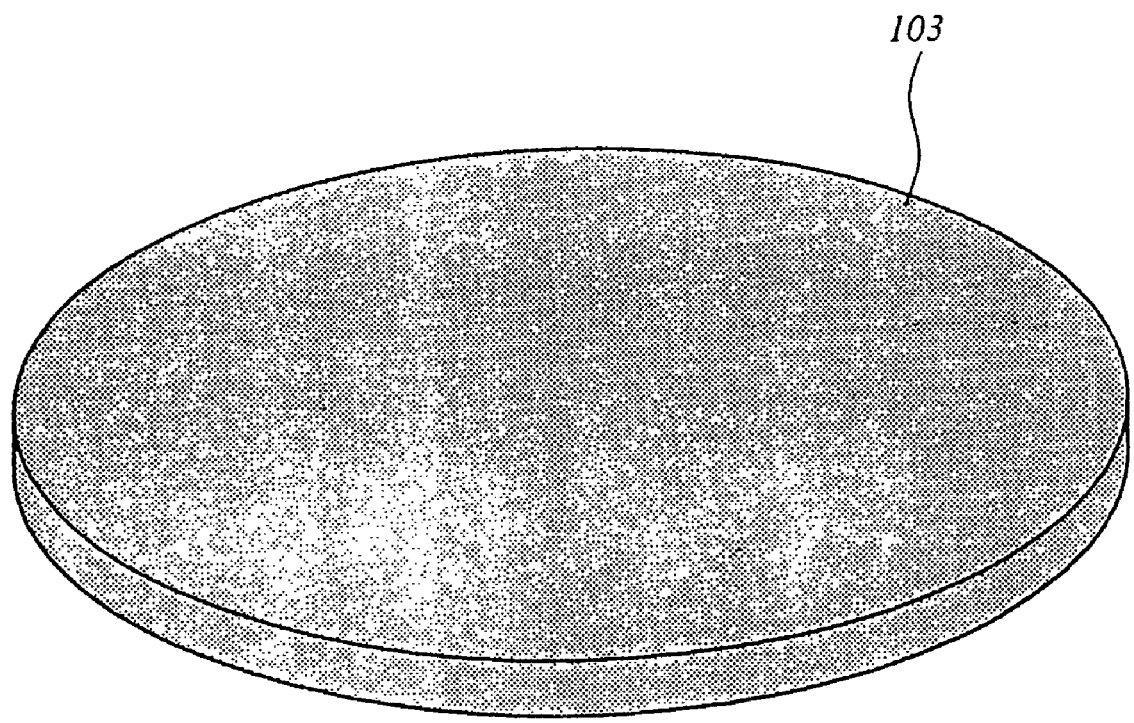
FIG. 11 is a perspective view of a Co target.

FIG. 11 is a schematic view of the Co target 103 described above. The Co target 103 used in this embodiment has a Co purity of at least 99.99% and a Fe or Ni content of not greater than 10 ppm, or the Fe and Ni contents of not greater than 50 ppm. Preferably, the Co purity is at least 99.99% and the Fe and Ni contents are not greater than 10 ppm and more preferably, the Co purity is 99.999%. Such a high purity target 103 is produced by hot-pressing raw material powder of Co, that is refined by an electrolytic process, or the like, until the Co purity described above can be obtained, into a sinter and machining the sinter into a disk.

Figure 12:
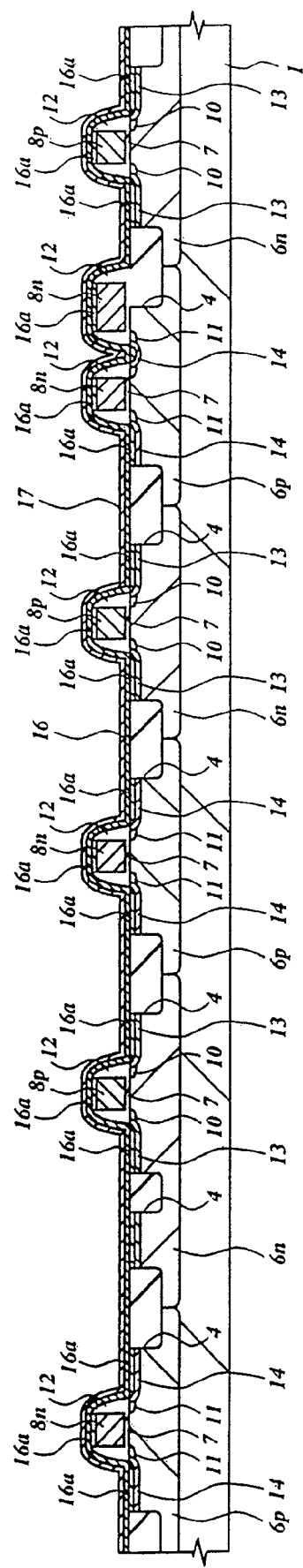

Next, first heat-treatment is carried out so as to allow Co and Si to react with each other as shown in FIG. 12 and to form a CoSi layer 16a on the surface of each of the p+ semiconductor region 13, the n+ semiconductor region 14 and the gate electrodes 8n and 8p. This first heat-treatment is executed by using an RTA (Rapid Thermal Anneal) apparatus in a nitrogen atmosphere for about 30 seconds while the substrate temperature is kept at 525° C. or below. If the heat-treating temperature is too low, however, the progress of the silicidization reaction is impeded; hence, the substrate temperature is preferably set to at least 475° C.

Figure 13:
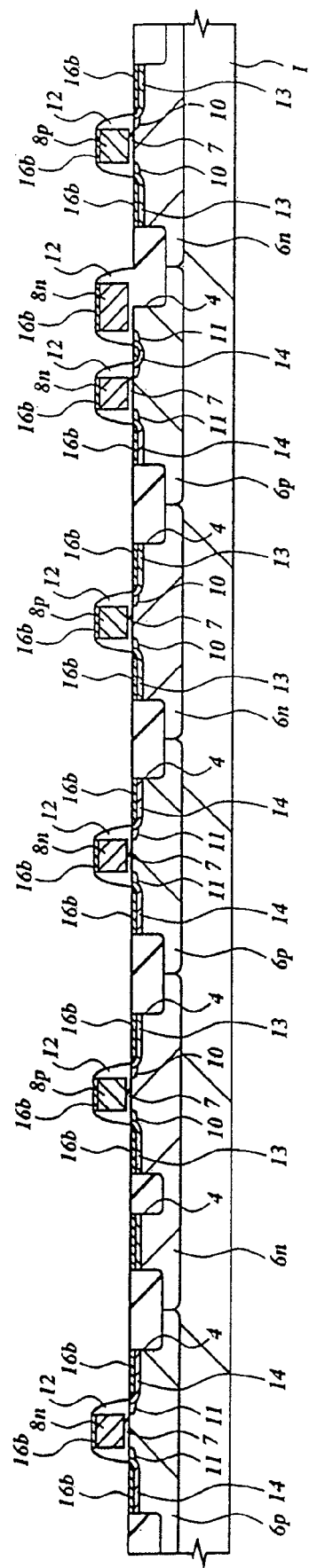

After the oxidation preventing film 17 and the unreacted Co film 16 are removed by wet etching using an aqueous solution of NH$_4$OH+H$_2$O$_2$ and then an aqueous solution of HCl+H$_2$O$_2$, second heat-treatment is carried out so as to cause the phase transition of the CoSi layer 16a to a CoSi$_2$ layer 16b as shown in FIG. 13. The second heat-treatment is executed by using the RTA apparatus in a nitrogen atmosphere for about one minute while the substrate temperature is set to 650 to 800° C.

Figure 14:
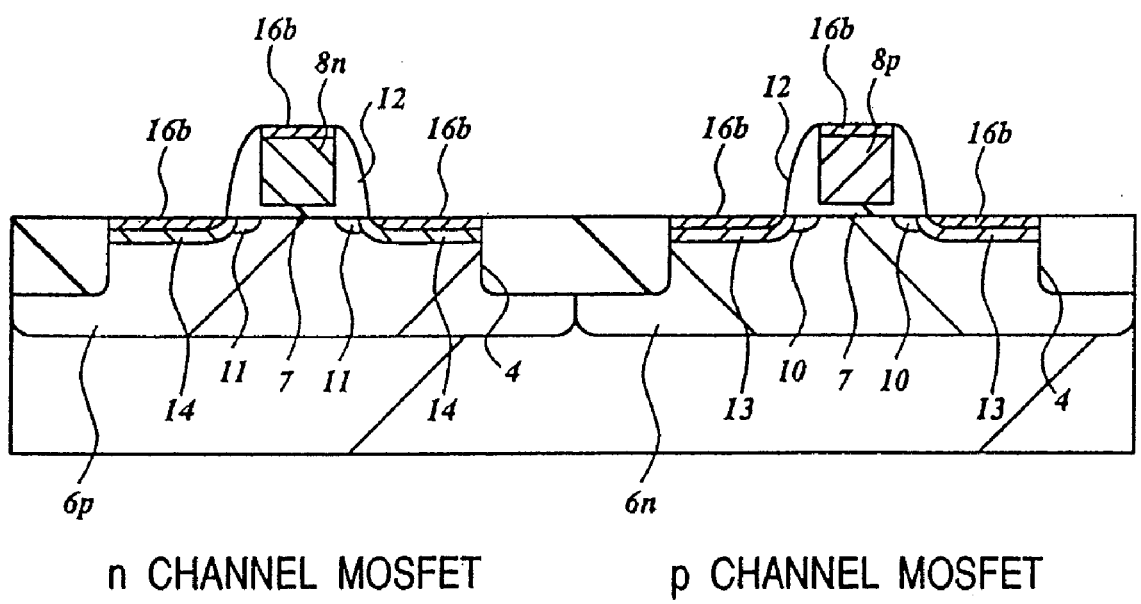
FIG. 14 is an enlarged view of n- and p-channel MOSFETs each having a Co silicide layer formed on the surface of the gate electrode, the source and drain.
Figure 15:
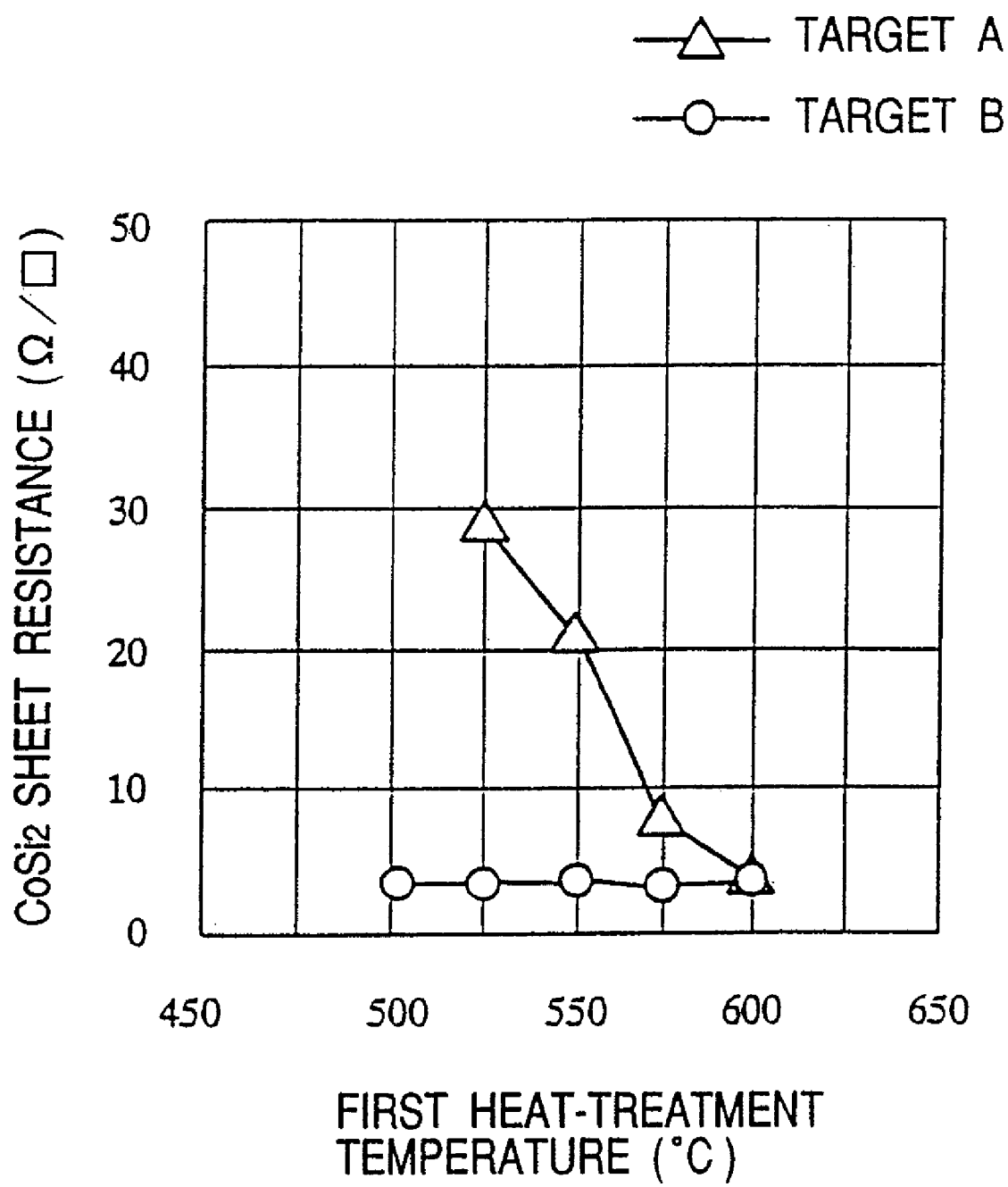
FIG. 15 is a graph showing the relationship between the sheet resistance of the Co silicide layer and the first heat-treatment temperature.
Figure 16:
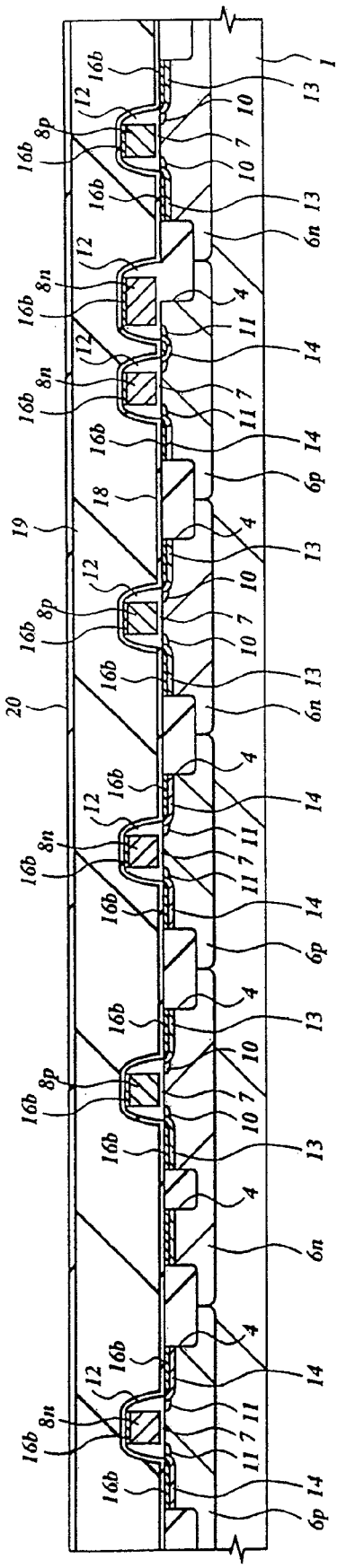

FIG. 14 is an enlarged view of the n channel MOSFET and the p channel MOSFET each including the CoSi$_2$ layer 16b formed on the surface of the gate electrode and the source and drain. FIG. 15 is a graph showing the relationship between the sheet resistance of the CoSi$_2$ layer 16b and the first heat-treatment temperature. A high purity product having a Co purity of 99.998% (target B) and a low purity product having a Co purity of 99.9% (target A) are used as the Co target. Table 1 shows the kind of impurities contained in these targets A and B and their contents.

TABLE 1

| | (unit: wt ppm) | |
|---|---|---|
| element | target A | target B |
| Fe | 50 | 4 |
| Ni | 250 | 6 |
| Cu | <10 | <1 |
| Al | <10 | <1 |
| C | <10 | 6 |
| O | 6 | 50 |
| Na | <1 | <0.05 |
| K | <1 | <0.05 |

As shown in the drawings, the CoSi$_2$ layer 16b obtained from the high purity target B having a purity of 99.998% has low first heat-treating temperature dependence of CoSi layer 16a and becomes virtually uniform at a temperature within the range of from 500 to 600° C. Therefore, a low sheet resistance of about 4 Ω/square can be obtained throughout this temperature range.

Therefore, even when the first heat-treatment temperature is set to a low temperature, a CoSi$_2$ layer having a low sheet resistance can be obtained. As the heat-treatment temperature is lowered, the rate of the silicidization reaction becomes low and film thickness controllability by the heat-treatment time can be improved. Therefore, the film thickness of the CoSi$_2$ layer 16b can be set more easily to the range in which the junction leakage current does not increase. Further, as the heat-treatment temperature is lowered, creep-up of the CoSi$_2$ layer 16b can be prevented.

As to the CoSi$_2$ layer obtained from the target A having the purity of 99.9%, on the other hand, the sheet resistance increases remarkably when the heat-treatment temperature is low because the film thickness of the Co film becomes small. To obtain the sheet resistance equal to that of the CoSi$_2$ layer obtained from the high purity target B, the first heat-treatment temperature must be raised to 600° C.

When the CoSi$_2$ layer is formed on the surface of each of the gate electrode and the source and drain of the MOSFET by silicidizing the Co film which is deposited by sputtering in the manner described above, the embodiment of the present invention using the high purity Co target having a Co purity of at least 99.99% and the Fe and Ni contents of not greater than 10 ppm, preferably the high purity Co target having a Co purity of 99.999%, can provide the Co silicide layer 16b having a low resistance and a low junction leakage current. Therefore, this embodiment can promote the high operation speed, high performance and low power consumption of devices using very small MOSFETs having a gate length of 0.25 μm.

Next, a 100 nm-thick silicon oxide film 18 is deposited to the semiconductor substrate 1 by a normal pressure CVD process, and a 300 to 500 nm-thick silicon oxide film 19 is further deposited by a plasma CVD. The silicon oxide film 19 is then polished by chemical mechanical polishing (CMP) and its surface is made flat and smooth. After a 200 nm-thick PSG film 20 is deposited on the silicon oxide film 19 by a CVD process using monosilane+oxygen+phosphine as a source gas, heat-treatment (sintering) is carried out at a temperature within the range of 700 to 800° C. for removing the moisture in the PSG film 20. Because this embodiment can sufficiently secure the film thickness of the $CoSi_2$ layer 16b, agglomeration of the $CoSi_2$ layer 16b can be restricted even when sintering is carried out at a high temperature. In consequence, the increase in the sheet resistance of the $CoSi_2$ layer 16b can be prevented and the process margin can be improved.

Figure 17:
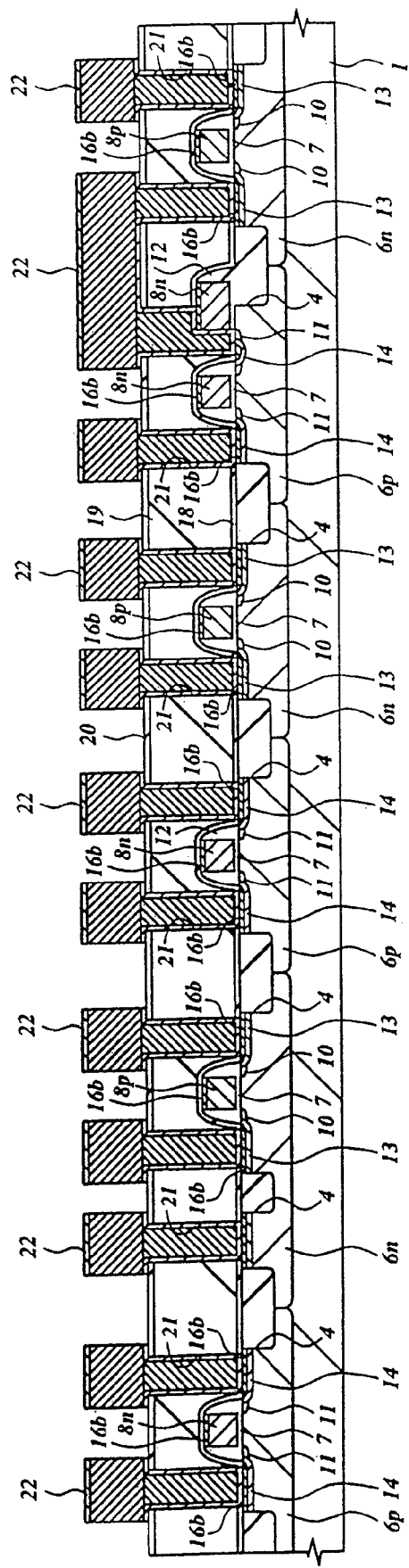

As shown in FIG. 17, the PSG film 20 and the silicon oxide films 18 and 19 are etched by using the photoresist as the mask so as to form a connection hole 21 on each of the $p^+$ and $n^+$ semiconductor regions 13 and 14, and then a first layer wiring line 22 is formed on the PSG film 20. To form this first layer wiring line 22, a first TiN film is thinly deposited on the PSG film 20 by CVD, and after a W film is deposited thick on this TiN film, the W film is etched back in such a manner as to leave it inside the connection hole 21. After an Al film and a second TiN film are deposited by sputtering on the first TiN film, the second TiN film, the Al film and the first TiN film are patterned by using the photoresist as the mask.

Figure 18:
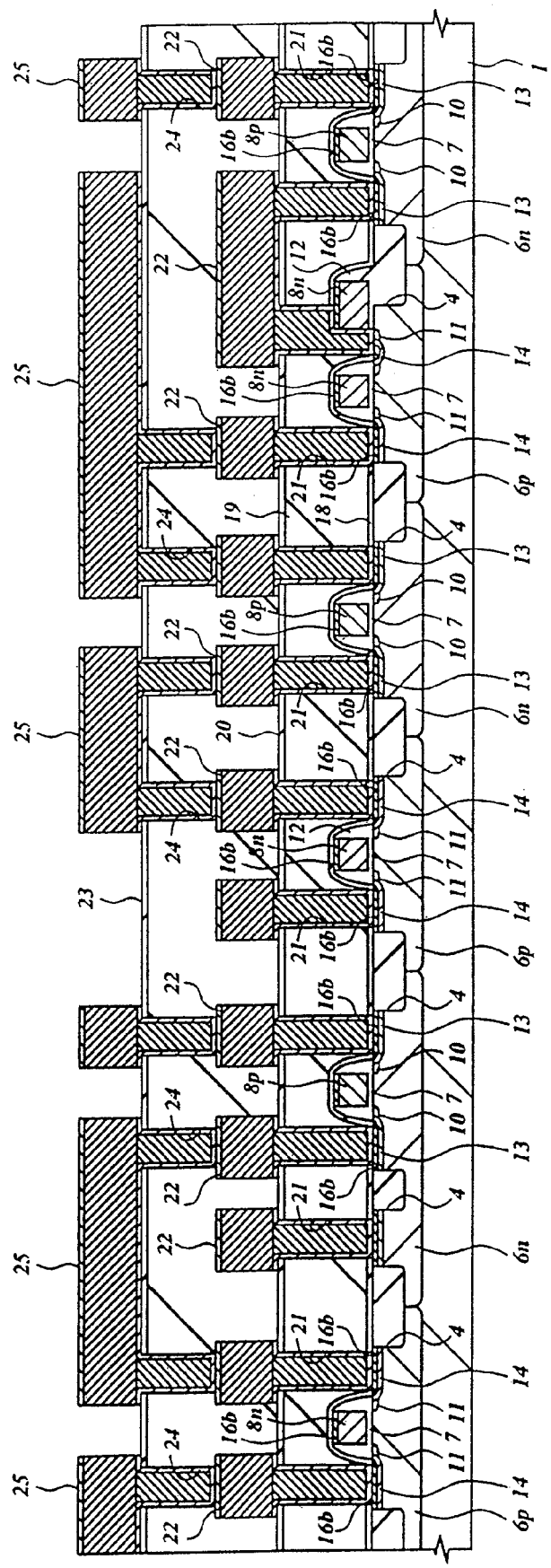

Next, a first interlayer insulating film 23 is formed on the first layer wiring line 22 as shown in FIG. 18. After the surface of this interlayer insulating film 23 is made flat and smooth by chemical mechanical polishing, a connection hole 24 is formed in the first interlayer insulating film 23. Subsequently, a second layer wiring line 25 is formed on the first interlayer insulating film 23, and is electrically connected to the first layer wiring line 22. The first interlayer insulating film 23 comprises the silicon oxide film deposited by plasma CVD and the second layer wiring line 25 is made of the same material as that of the first layer wiring line 22.

Figure 19:
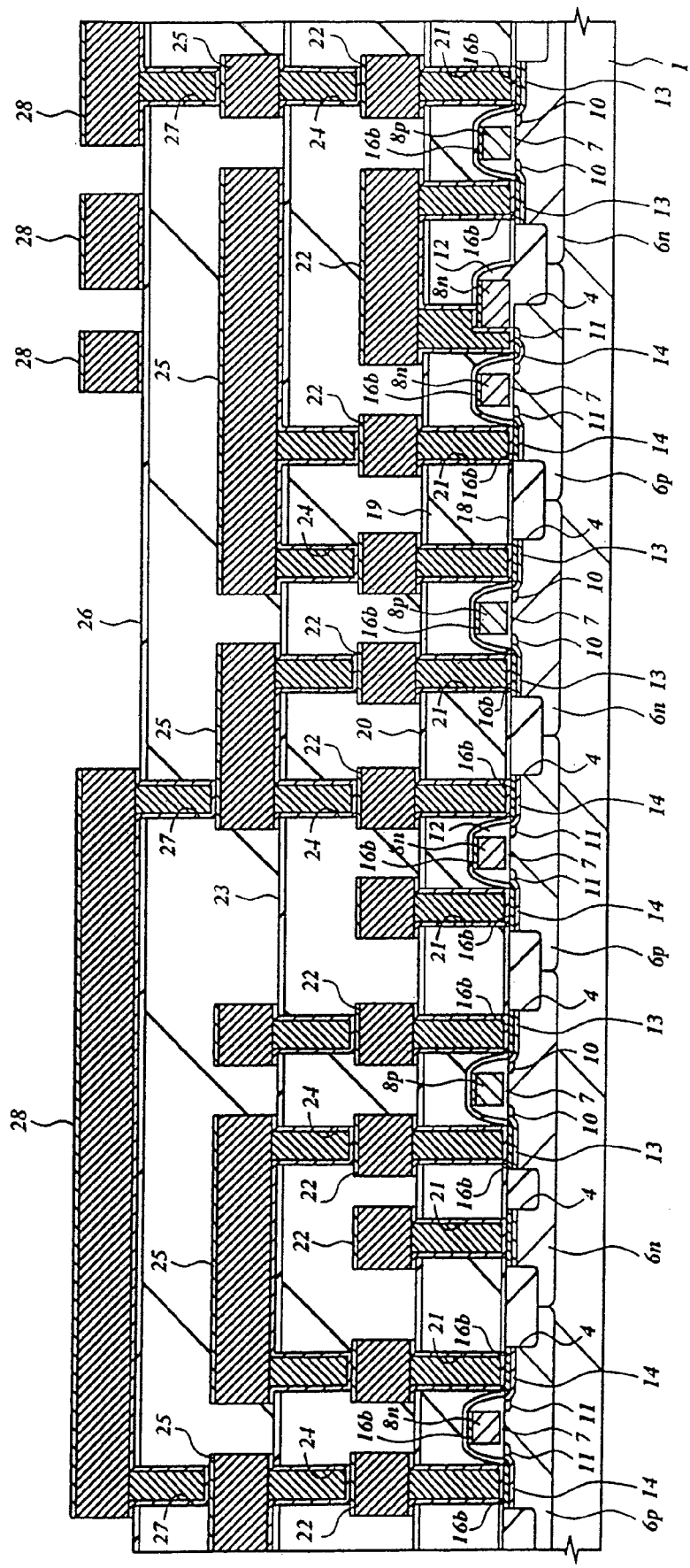

A second interlayer insulating film 26 is then formed on the second layer wiring line 25 in the same way as above as shown in FIG. 19. After the surface of this film 26 is made flat and smooth and a connection hole 27 is formed, a third layer wiring line 28 is formed on the second interlayer insulating film 26.

Figure 20:
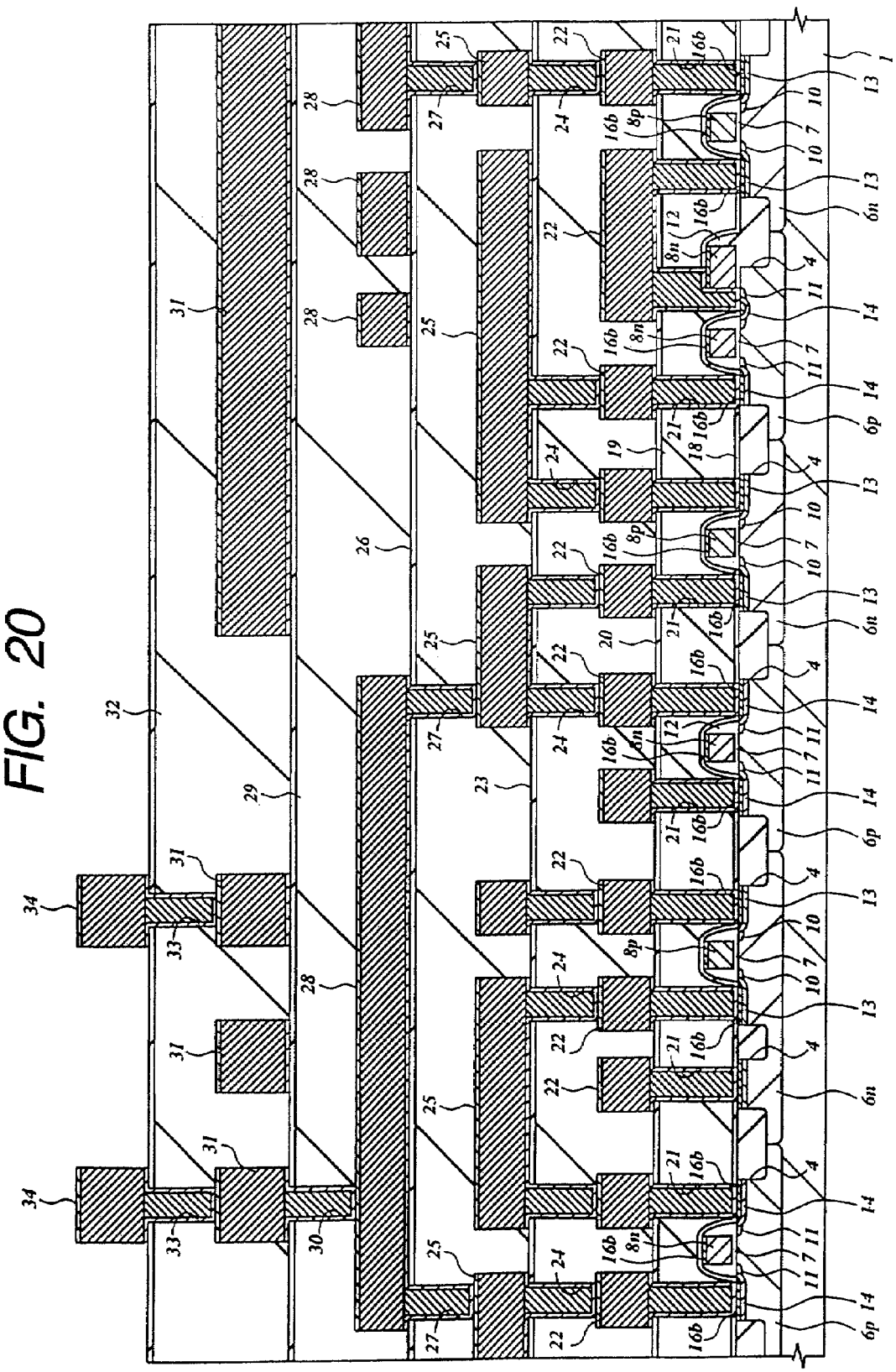

Thereafter, a third interlayer insulating film 29 is formed on the third layer wiring line 25 as shown in FIG. 20. After the surface of this film 29 is made flat and smooth and a connection hole 30 is formed, a fourth layer wiring line 31 is formed on the third interlayer insulating film 29, then a fourth interlayer insulating film 32 is formed on the fourth layer wiring line 31. After the surface of this film 32 is made flat and smooth and a connection hole 33 is formed, a fifth layer wiring line 34 is formed on the fourth interlayer insulating film 32. In this way, the semiconductor integrated circuit device of this embodiment is virtually completed.

Although the invention completed by the present inventors has thus been described concretely with reference to the embodiments thereof, the present invention is not particularly limited to these embodiments but can naturally be changed or modified in various ways without departing from the scope thereof.

For example, the fabrication of the present invention that uses the high purity Co target can be applied to the case where only the surface of the source and drain of the MOSFET is converted to the Co silicide, too.

INDUSTRIAL APPLICABILITY

As described above, the fabrication method of a semiconductor integrated circuit device according to the present invention can improve film thickness controllability of the Co silicide layer and can obtain a Co silicide layer having a low resistance and a low junction leakage current. Therefore, this fabrication method can be applied suitably to a Salicide process using the Co target.

What is claimed is:

1. A method of fabricating a semiconductor integrated circuit device, comprising the steps of:
   (a) forming an isolation groove in a silicon surface of a first major surface of a wafer, so as to divide the silicon surface into two regions which are first and second regions;
   (b) after step (a), forming a first insulating film of silicon oxide by chemical vapor deposition in such manner that the first insulating film covers the silicon surface;
   (c) after step (b), polishing the first insulating film so as to planarize the first major surface of the wafer;
   (d) after step (c), forming two gate electrodes, to be N- and P-type gate electrodes, respectively over the first and second regions, each of said two gate electrodes having a silicon film to be a silicon conductive film;
   (e) forming N-type source and drain regions in the first region, said N-type source and drain regions formed by doping with phosphorus and followed by first heat-treatment;
   (f) forming P-type source and drain regions in the second region, said P-type source and drain regions formed by doping with boron and followed by second heat-treatment;
   (g) after the steps (d), (e), and (f), exposing surface portions of the silicon surface over said N-type and P-type source regions and drain regions;
   (h) after the step (g), depositing a cobalt film covering at least the exposed surface portions, by sputtering, from a cobalt sputtering target which, apart from carbon and oxygen impurities, is at least 99.99 wt. % pure, wherein a sum of Fe and Ni in the cobalt sputtering target is not greater than 50 ppm by weight, and wherein the sputtering is performed in such a manner that the composition of the deposited cobalt film is substantially the same as that of the cobalt sputtering target;
   (i) after the step (h), performing first rapid thermal annealing at a first temperature to the first major surface formed with the cobalt film so as to form cobalt monosilicide films over the surface portions, leaving a remaining cobalt film not formed into cobalt monosilicide, wherein the first temperature is a temperature such that creep-up across the first and second insulating side walls substantially does not take place;
   (j) after the step (i), removing the remaining cobalt film by wet etching; and
   (k) after the step (j), performing second rapid thermal annealing at a second temperature higher than the first temperature to the first major surface so as to form cobalt disilicide films over the surface portions;
   (l) after the step (k), forming a second insulating film over the silicon surface;

(m) after the step (l), forming a third insulating film over the second insulating film such that the third insulating film has a thickness greater than a thickness of the second insulating film; and (n) after the step (l), performing a thermal annealing to the wafer, wherein the second heat treatment temperature is higher than the first heat treatment temperature.

2. A method of fabricating a semiconductor integrated circuit device according to claim 1, the step (m) comprising the substeps of:

(o) after the step (l), forming a fourth insulating film over the second insulating film;

(p) after the step (o), polishing the fourth insulating film so as to planarize the fourth insulating film; and (q) after the step (p), forming a fifth insulating film over the fourth insulating film such that the third insulating film has a thickness greater than a thickness of the second insulating film.

3. A method of fabricating a semiconductor integrated circuit device according to claim 1, wherein the first temperature is not higher than 525 degrees centigrade.

4. A method of fabricating a semiconductor integrated circuit device according to claim 1, wherein the cobalt sputtering target includes a sum of Fe and Ni which is not greater than 10 ppm by weight.

5. A method of fabricating a semiconductor integrated circuit device according to claim 1, wherein said cobalt sputtering target, apart from carbon and oxygen impurities, is 99.999 wt. % pure.

6. A method of fabricating a semiconductor integrated circuit device according to claim 1, wherein the first temperature is not lower than 475 degrees centigrade.

7. A method of fabricating a semiconductor integrated circuit device according to claim 1, wherein the semiconductor integrated circuit device is designed under design rules not larger than 0.25 micron.

8. A method of fabricating a semiconductor integrated circuit device according to claim 7, wherein the cobalt sputtering target, apart from carbon and oxygen impurities, is 99.999 wt. % pure.

9. A method of fabricating a semiconductor integrated circuit device according to claim 1, wherein the second temperature is from 650 degrees centigrade to 800 degrees centigrade.

* * * * *